US012771125B2

(12) United States Patent
Rajan et al.

(10) Patent No.: US 12,771,125 B2
(45) Date of Patent: Oct. 20, 2026

(54) SYSTEM INCLUDING AN IDEAL DIODE CIRCUIT FOR NEGATIVE TRANSIENT PROTECTION

(71) Applicant: Connaught Electronics Ltd., Tuam (IE)

(72) Inventors: Sarun Rajan, Troy, MI (US); Francois Desfleurs, Créteil (FR)

(73) Assignee: Connaught Electronics Ltd. (IE)

( * ) Notice: Subject to any disclaimer, the term of this patent is extended or adjusted under 35 U.S.C. 154(b) by 172 days.

(21) Appl. No.: 18/655,146

(22) Filed: May 3, 2024

(65) Prior Publication Data

US 2025/0343409 A1 Nov. 6, 2025

(51) Int. Cl.

*H02H 11/00* (2006.01)
*B60R 16/03* (2006.01)
*H02J 7/68* (2026.01)
*H10D 84/80* (2025.01)

(52) U.S. Cl.

CPC ........... *H02H 11/003* (2013.01); *B60R 16/03* (2013.01); *H02J 7/68* (2026.01); *H10D 84/811* (2025.01)

(58) Field of Classification Search

CPC ........ H02H 11/003; H02H 9/021; H02H 3/18; H02H 9/005; B60R 16/03; H02J 7/68; H10D 84/811
USPC .......................................................... 361/82
See application file for complete search history.

(56) References Cited

U.S. PATENT DOCUMENTS 10,291,011 B2 5/2019 Redler
2019/0027945 A1* 1/2019 Gagnon ............... H02H 11/003
2021/0167592 A1* 6/2021 Li .......................... H02H 9/025
(Continued)

FOREIGN PATENT DOCUMENTS

CN 116169998 A 5/2023
EP 1860774 A1 11/2007
EP 4277067 A1 11/2023

OTHER PUBLICATIONS

A. V. Dias, J. A. Pomilio and S. Finco, "Limitation of Initial Surge in Latching Current Limiters (LCL)," 2023 IEEE 8th Southern Power Electronics Conference and 17th Brazilian Power Electronics Conference (SPEC/COBEP), Florianopolis, Brazil, 2023, pp. 1-7 (Year: 2023).*

(Continued)

*Primary Examiner* — Sreeya Sreevatsa
(74) *Attorney, Agent, or Firm* — Dickinson Wright PLLC

(57) ABSTRACT

A circuit includes a battery configured to supply voltage to the circuit, a metal-oxide-semiconductor field effect transistor (MOSFET) located within the circuit, an inductor in series with a drain channel of the MOSFET, a transistor in series with the inductor, wherein an emitter channel of the transistor is connected with the inductor and a base of the transistor is connected to a ground channel of the MOSFET, a diode connected to a source channel and the base of the transistor, in response to the transistor and diode detecting a difference in voltage, the transistor is configured to turn off the MOSFET utilizing a gate terminal, in response to the MOSFET turning off, the inductor is configured to generate an additional response time to the circuit, and in response to a voltage drop, a capacitor on a load side is configured to supply current to the load side.

20 Claims, 4 Drawing Sheets

(56) References Cited

U.S. PATENT DOCUMENTS

| | | | | |
|---|---|---|---|---|
| 2022/0006374 | A1* | 1/2022 | Warnes ................ | H02H 11/003 |
| 2023/0361551 | A1* | 11/2023 | Stokman ................ | H02H 7/268 |

OTHER PUBLICATIONS

International Search Report and Written Opinion for PCT/US2025/027054, Dated Jul. 14, 2025, All together 12 Pages.

* cited by examiner

SYSTEM INCLUDING AN IDEAL DIODE CIRCUIT FOR NEGATIVE TRANSIENT PROTECTION

TECHNICAL FIELD

The present disclosure relates to circuits, including those used in a vehicle systems with electronic control units with a metal-oxide-semiconductor field effect transistor (MOSFETs).

BACKGROUND

Vehicle ECUs are powered from battery lines. These battery lines allow for chances of reverse voltage and transient pulses on the battery lines, which can damage the ECUs. Thus, vehicle ECUs should be protected from reverse voltage and transient pulses. Current circuitry will not work for a negative transient pulse when the drain source resistance of the MOSFET is low. The negative pulse will pass through the MOSFET before it is turned off, thus causing a high current passing through the MOSFET to the source side and reducing the charge stored in the load side bulk capacitor. This may reduce the effectiveness of the protection circuit. Therefore, current technology has drawbacks and will not work for a negative transient. Such technology may include controllers that can manage the reverse voltage protection, for example. It may be beneficial for a circuit that is needed to protect the reverse battery and transients. Some systems may utilize a diode on the VBAT line, a field-effect transistor on the VBAT line that can provide for protection, controllers that can manage voltage protection, etc. Each of the current solutions have drawbacks.

SUMMARY

A first embodiment discloses a circuit in a vehicle electronic control unit (ECU) that includes a battery that includes a battery line configured to supply voltage to the circuit that is connected to a load side including at least a capacitor, a metal-oxide-semiconductor field effect transistor (MOSFET) located within the circuit, an inductor in series with the MOSFET, wherein the inductor is in series with a source channel of the MOSFET, a transistor in series with the inductor, wherein an emitter channel of the transistor is connected with the inductor and a base of the transistor is connected to a ground channel of the MOSFET, a diode connected to a drain channel of the MOSFET and the base of the transistor, in response to the transistor and diode detecting a difference in voltage, the transistor is configured to turn off the MOSFET utilizing a gate terminal of the MOSFET, in response to the MOSFET turning off, the inductor is configured to generate an additional response time to the circuit, and in response to a voltage drop in the circuit, a capacitor on a load side is configured to supply current to the load side during a negative transient duration.

A second embodiment discloses, a circuit in a vehicle electronic control unit (ECU) that includes a battery that includes a battery line configured to supply voltage to the circuit that is connected to a load side including at least a capacitor, a metal-oxide-semiconductor field effect transistor (MOSFET) located within the circuit, an inductor in series with the MOSFET, wherein the inductor is in series with a first channel of the MOSFET, a transistor in series with the inductor, wherein an emitter channel of the transistor is connected with the inductor and a base of the transistor is connected to a second channel of the MOSFET, a diode connected to a third channel of the MOSFET and the base of the transistor, and in response to the transistor and diode detecting a difference in voltage, the transistor is configured to turn off the MOSFET and the inductor is configured to generate an additional response time to the circuit for the capacitor on a load side of the circuit to supply current to the load side.

A third embodiment discloses a method of providing a circuit in a vehicle electronic control unit (ECU) that includes supplying voltage to the circuit utilizing a battery that includes a battery line that is connected to a load side including at least a capacitor, providing a metal-oxide-semiconductor field effect transistor (MOSFET) within the circuit, providing an inductor in series with a first channel of the MOSFET, providing a transistor in series with the inductor, wherein an emitter channel of the transistor is connected with the inductor and a base of the transistor is connected to a second channel of the MOSFET, connecting a diode to both a third channel of the MOSFET and the base of the transistor, in response to the transistor and diode detecting a difference in voltage, turning off the MOSFET, supplying current to a capacitor on a load side of the circuit, and in response to the MOSFET turning off, generating an additional response time to the circuit.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative bases for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical application. Various combinations and modifications of the features consistent with the teachings of this disclosure, however, could be desired for particular applications or implementations.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions.

To prevent high current to the source, a system may need to improve the response time of the circuit. The circuit may have to turn off the MOSFET quickly when the source voltage is lower than the load side voltage. To achieve this, the system can add an inductor in the circuit, among other things. The inductor may slow down the negative pulse and provide an additional time to the transistor to turn off the MOSFET. The additional response time may be the time constant of the inductor ($\tau$=L/R). A transistor and diode may be utilized to detect the difference in voltage and transistor to turn off the MOSFET within this time. This may prevent the high current to the source from the load side. Thus, the bulk capacitor may supply the current to the load side during the negative transient duration.

Figure 1:
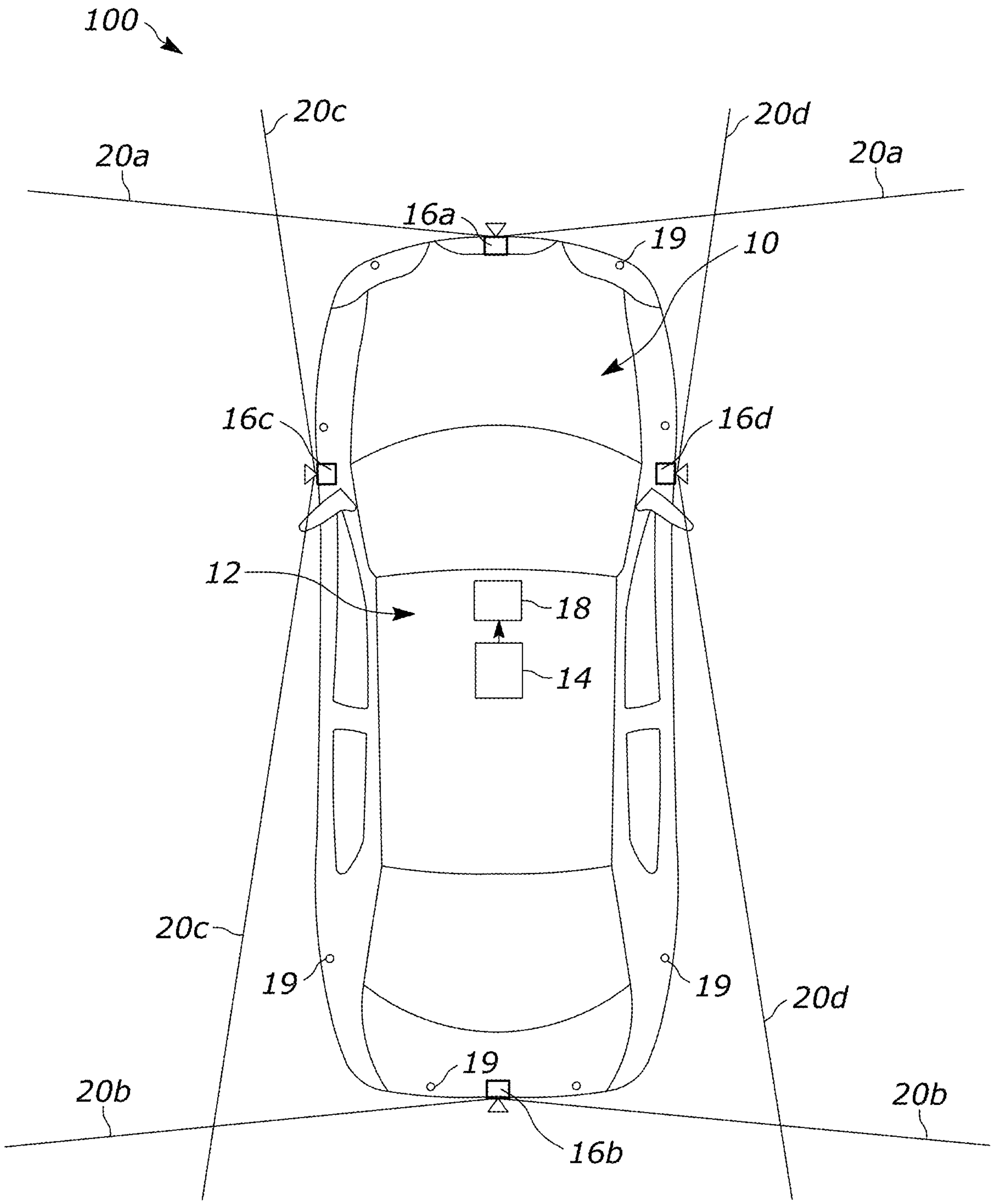
FIG. 1 illustrates a schematic of a vehicle according to an embodiment with various cameras and proximity sensors.

FIG. 1 illustrates a schematic 100 of a vehicle 10 according to an embodiment, shown here from a top view. The vehicle 10 is a passenger car, but can be other types of vehicles such as a truck, van, or sports utility vehicle (SUV), or the like. The vehicle 10 includes a camera system 12 which includes an electronic control unit (ECU) 14 connected to a plurality of cameras 16*a*, 16*b*, 16*c*, and 16*d*. In general, the ECU 14 includes one or more processors programmed to process the images data associated with the cameras 16*a-d* and generate a composite top view on a vehicle display 18. In addition, as will be described further below, the vehicle 10 includes a plurality of proximity sensors (e.g., ultrasonic sensors, radar, sonar, LiDAR, etc.) 19. The proximity sensors 19 can be connected to their own designated ECU that develops a sensor map of objects external to the vehicle. Alternatively, the proximity sensors can be connected to ECU 14. The ECU 14 may include a circuit as described below in FIG. 2 and FIG. 3.

The ECUs disclosed herein may more generally be referred to as a controller. In the case of an ECU of a camera system 12, the ECU can be capable of receiving image data from the various cameras (or their respective processors), processing the information, and outputting instructions to combine the image data in generating a composite top view, for example. In the case of an ECU associated with the proximity sensors 19, the ECU can be capable of receiving sensor data from the various proximity sensors (or their respective processors), processing the information, and outputting a sensor map of objects surrounding the vehicle; this ECU can also be capable of causing alerts to be sent to the driver during parking maneuvers that might warn the driver of the proximity of the detected objects. In this disclosure, the terms "controller" and "system" may refer to, be part of, or include processor hardware (shared, dedicated, or group) that executes code and memory hardware (shared, dedicated, or group) that stores code executed by the processor hardware. The code is configured to provide the features of the controller and systems described herein. In one example, the controller may include a processor, memory, and non-volatile storage. The processor may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory. The memory may include a single memory device or a plurality of memory devices including, but not limited to, random access memory ("RAM"), volatile memory, non-volatile memory, static random-access memory ("SRAM"), dynamic random-access memory ("DRAM"), flash memory, cache memory, or any other device capable of storing information. The non-volatile storage may include one or more persistent data storage devices such as a hard drive, optical drive, tape drive, non-volatile solid-state device, or any other device capable of persistently storing information. The processor may be configured to read into memory and execute computer-executable instructions embodying one or more software programs residing in the non-volatile storage. Programs residing in the non-volatile storage may include or be part of an operating system or an application, and may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL. The computer-executable instructions of the programs may be configured to, upon execution by the processor, cause the harmonization techniques and algorithms described herein.

In the embodiment illustrated in FIG. 1, the cameras 16-*d* are located about different quadrants of the vehicle, although more than four cameras may be provided in the camera system 12. Each camera 16*a-d* may have a fish-eye lens to obtain images with an enlarged field of view, indicated by boundary lines 20*a-d*. In an example, a first camera 16*a* faces an area in front of the vehicle, and captures images with a field of view indicated by boundary lines 20*a*. The first camera 16*a* can therefore be referred to as the front camera. A second camera 16*b* faces an area behind the vehicle, and captures images with a field of view indicated by boundary lines 20*b*. The second camera 16*b* can therefore be referred to as the rear camera. A third camera 16*c* faces an area on the left side of the vehicle, and captures images with a field of view indicated by boundary lines 20*c*. The third camera 16*c* can therefore be referred to as the left camera, or left-side camera. The third camera 16*c* can also be mounted on or near the vehicle's left wing mirror, and can therefore be referred to as a mirror left (ML) camera. A fourth camera 16*d* faces an area on the right side of the vehicle, and captures images with a field of view indicated by boundary lines 20*d*. The fourth camera 16*d* can therefore be referred to as the right camera, or right-side camera. The fourth camera 16*d* can also be mounted on or near the vehicle's right wing mirror, and can therefore be referred to as a mirror right (MR) camera. The images (or the associated image data) originating from the cameras 16*a-d* can be processed by the ECU 14 (e.g., stitched together, distorted, combined, and harmonized) to generate the composite top view on the vehicle display 18.

Figure 2:
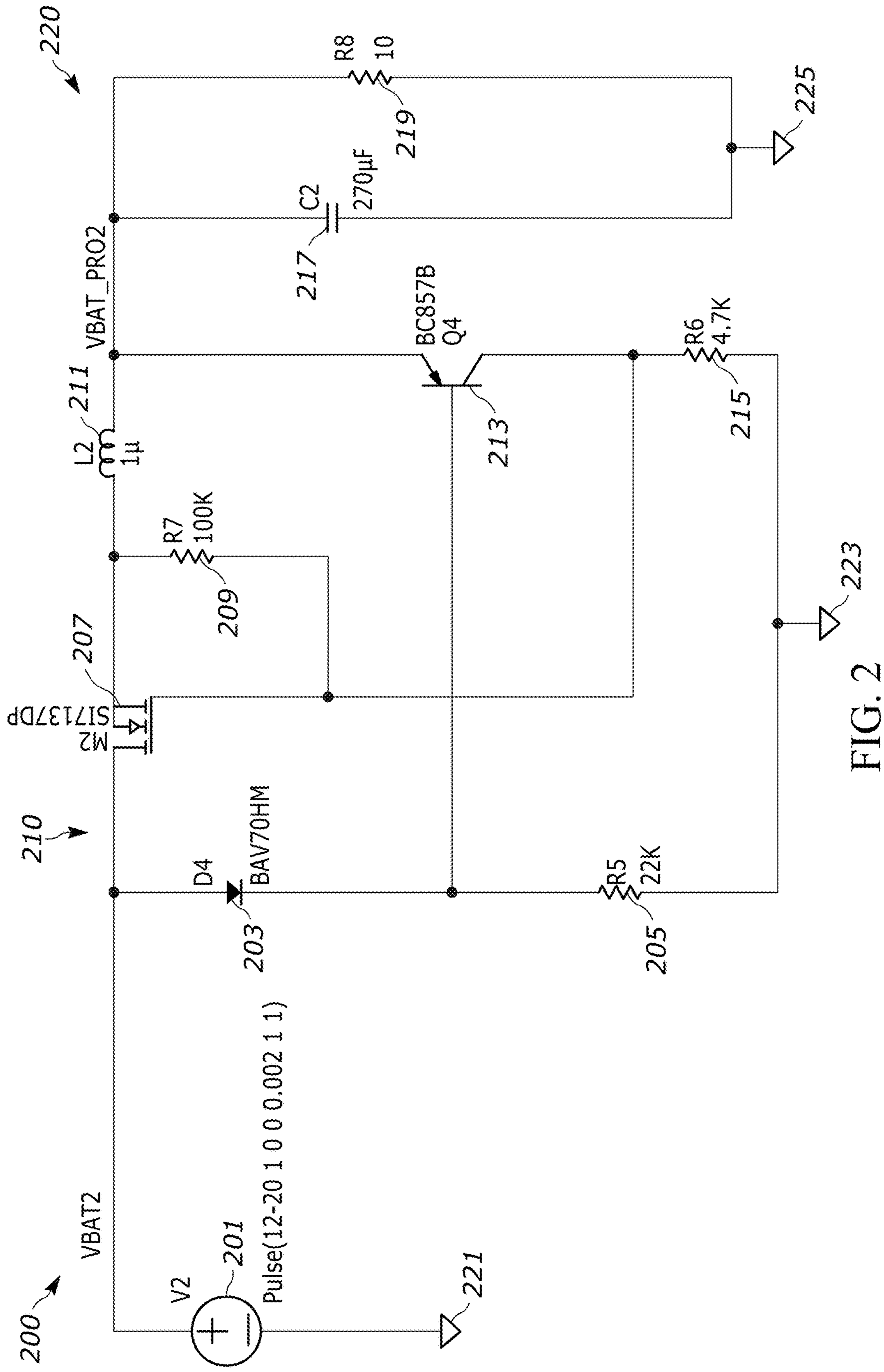
FIG. 2 illustrates an example of an embodiment of a circuit in a vehicle electronic control unit (ECU) utilizing an inductor

FIG. 2 illustrates an example of a circuit in a vehicle electronics control unit (ECU). In one embodiment, the circuit 200 may include a battery 201 that is grounded via ground 221. The battery 201 delivers power to the circuit 200, first via the line side 210 portion of the circuit and then via the load side 220. The battery 201 may be grounded via ground terminal 221. The circuit 200 may include various ground terminals, however, located on the load side 220 and the line side 210, for example. While various electrical components and specific values, these components may be changed or swamped for different components and values without departing from the spirit of the invention. For example, minor changes to location of components or values are within the various embodiments disclosed herein.

The circuit may include a MOSFET 207, or Metal-Oxide-Semiconductor Field-Effect Transistor, is a type of transistor used in electronic devices for various applications, including amplification and switching. The MOSFET may be a field-effect transistors, which control the flow of electrical current using an electric field. The MOSFET 207 may include a gate electrode that includes a metal. An insulating layer (e.g., oxide) may separate the gate from the semiconductor material. The semiconductor material is usually silicon. The MOSFET may include three terminals: (1) Gate; (2) Source (3) Drain. The gate (G) terminal that controls the flow of current between the other two terminals. The source (S) terminal from which current flows into the transistor. The MOSFET may include the Drain terminal through which current exits the transistor.

The flow of current between the source and drain terminals may be controlled by the voltage applied to the gate terminal. The MOSFET may operate based on the electric field created by the voltage at the gate, which influences the conductivity of the semiconductor channel between the source and drain. There are several different types of MOSFETS. One type of MOSFET may be a N-Channel MOSFET (NMOS) or a P-Channel MOSFET (PMOS). Any MOSFET type may be contemplated according to various embodiments.

MOSFETs may be widely used in electronic circuits for both analog and digital applications. In digital circuits, MOSFETs may be fundamental building blocks for constructing logic gates and memory cells. In analog circuits, MOSFETs may be used in amplifiers, oscillators, and other signal processing applications. MOSFETs may be known for their high input impedance, low power consumption, and versatility in various electronic applications. They are a crucial component in modern semiconductor technology and play a vital role in integrated circuits and electronic devices.

The circuit 200 may include a first sub-circuit 210 and a second sub-circuit 220 in one embodiment. The circuit 200 may be a diode circuit for protection against negative transient flow. The first sub-circuit 210 may be directly connected to the voltage and can be considered the "line side" and the second sub-circuit 220 may be considered a "load-side" circuit. The load side 220 may be supplied voltage/current via the line side 210. On the line side, the MOSFET may be connected to a diode 203 (e.g. DIODE D4). The diode 203 may be in parallel with the MOSFET 207 in one embodiment. The diode 203 may work with the transistor 213 to measure voltage of the circuit, such as the voltage of the line side. As such, the diode 203 and transistor 213 may detect a difference in voltage and in response, the transistor 213 may be configured to turn off the MOSFET 207. The transistor 213 may utilize a gate terminal to turn off the MOSFET 207. The inductor 211 may be configured to store energy in a magnetic field when an electric current flows through it. Thus, the inductor 211 may still store some energy when the MOSFET is turned off based on the detection of the voltage difference. The inductor 211 may be able to resist changes in current and thus work to supply current to the load side 220. The inductor 211 may also be utilized for filtering of the circuit. For example, the inductor may be utilized to block or allow the passage of certain frequencies, depending on the configuration of the circuit. Inductors may also be used in transformers for energy transfer between different circuits. Furthermore when the current through an inductor 211 is interrupted (for example, in a switch-off event like via the MOSFET), the stored energy in the magnetic field can be released back into the circuit.

The circuit may include a transistor 213. A transistor, in general, may be utilized for a variety of reasons in a circuit. In one example, a transistor may be utilize to amplify weak electrical signals, making them larger and suitable for further processing in electronic devices. A transistor can also act as a switch, controlling the flow of current in a circuit. When used as a switch, a transistor can be in either an "on" state (allowing current to flow) or an "off" state (blocking current). In one example, a transistor may be used in modulation circuits to alter the properties of signals, such as amplitude or frequency. In another example, a transistor may be utilized for digital logic and used to create logical gates and memory elements.

According to one embodiment, the transistor 213 may use to turn off the MOSFET within a time period that is within an additional response time of the induction of the inductor. The transistor may control the voltage that is applied to the gate terminal. The gate voltage may determine whether the MOSFET is either in an on state and conducting, or an off state and non-conducting.

There may be various resistors that are within the circuit. For example, resistor 205 (e.g. R5) and resistor 215 (e.g., R6) may be in parallel with each other. Resistor 205 may be in series with diode 203. Resistor 215 may be connected with transistor 213. In on example, the resistor 215 may be connected to a collector of transistor Q4. With respect to the MOSFET, there may be a resistor 209 (e.g. R7) in parallel with the MOSFET. In another embodiment the resistor 209 may be in parallel with inductor 211. In one example, the resistance of resistor R5 may be 22K ohms. In another embodiment the resistance of R6 may be 4.7 k ohms. Resistors R5 and R6 may lead to a ground terminal 223 of the line side. The resistor 209 (e.g., R7) may be 100 k ohms. The resistor 219 of the load side may be connected to a ground terminal 225 of the load side. While specific resistances are shown in the resistors of FIG. 2, the circuit may utilize any type of resistance range for the various resistors.

The load side may be connected via a capacitor 217 (e.g., C2) and resistor that are in parallel 219 (e.g., R8) with each other. The load side may be grounded as well. The load side may receive power from the VBAT_PRO2 line as shown in the FIG. 2. The voltage between the load side and source side may be measured by the transistor 213, in one embodiment. The transistor 213 and diode 203 may be utilized to detect a difference in voltage, the transistor is configured to turn off the MOSFET utilizing a gate terminal of the MOSFET. In response to the MOSFET 207 turning off, the inductor generates an additional response time to the circuit, and in response to a voltage drop various points on a circuit, a capacitor on a load side is configured to supply current to the load side during a negative transient duration. Despite the MOSFET 207 turning off, the circuit may never have negative voltage or current during that negative transient duration.

Thus according to one embodiment, a circuit may be a part of a vehicle electronic control unit (ECU). The circuit in the ECU may include a battery that includes a battery line (e.g. VBAT, VBAT_PRO1, VBAT_PRO2, etc.) configured to supply voltage to the circuit that is connected to a load side including at least a capacitor. The battery may be internal to the ECU or may be external to the ECU. The circuit may also include a metal-oxide-semiconductor field effect transistor (MOSFET). There may be an inductor in series with the MOSFET, and the inductor is in series with a source channel of the MOSFET as well. The circuit may also include a transistor in series with the inductor, and an emitter channel of the transistor is connected with the inductor and a base of the transistor is connected to a ground channel of the MOSFET. The circuit may also include a diode connected to the drain channel of the MOSFET and the base of the transistor. In response to the transistor and diode detecting a difference in voltage, the transistor is configured to turn off the MOSFET utilizing a gate terminal of the MOSFET. In response to the MOSFET turning off, the inductor generates an additional response time to the circuit, and in response to a voltage drop, a capacitor on a load side is configured to supply current to the load side during a negative transient duration.

Figure 3:
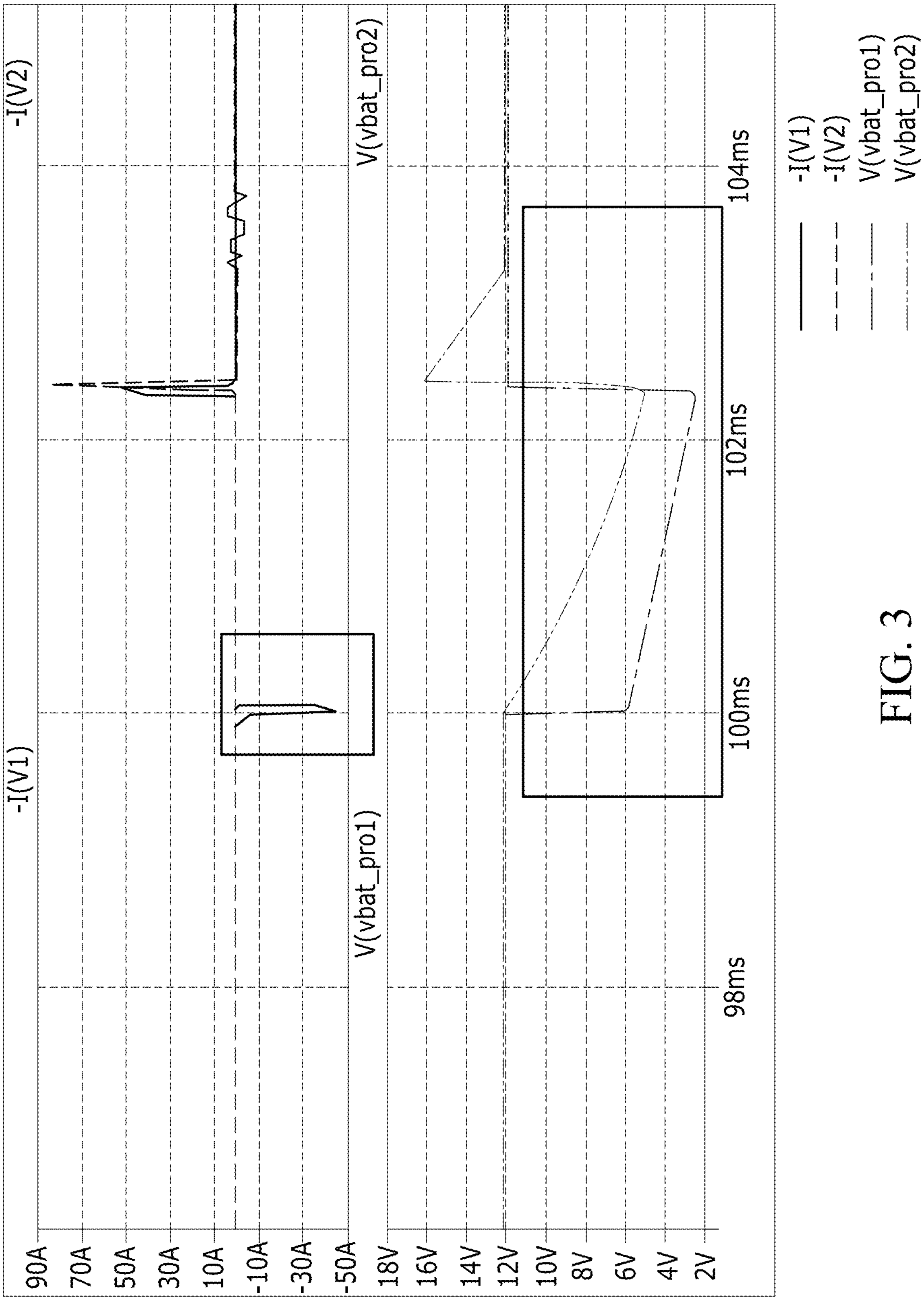
FIG. 3 illustrates an example graph illustrating voltage and current levels of an embodiment of FIG. 2 compared to a prior solution.

FIG. 3 is an example of graph showing results as related to an embodiment of the circuit of FIG. 2. As shown, the I(V1) may be a source current in a prior art circuit. I(V2) may an embodiment of a current load in a circuit according to an embodiment of the invention. The VBAT_PRO1 may be the previous output voltage and VBAT_PRO2 may be the improvement. The results may be for a 2 ms negative pulse, in one embodiment. The results shown as related to the embodiment may be utilizing a circuit such as one described in FIG. 2, however, any type of embodiment may be utilized.

As shown with respect to the source current at the top of the FIG. 3, the embodiment according to the invention (in one example) does not experience current drop off that is shown in the prior art at the 100 ms timeline. Furthermore, in between the 102 ms and 104 ms timeframe, the voltage that is output to the circuit is higher than that of the prior art. Thus, the output in the current embodiment may never experience negative values in current or voltage, but the prior art circuits may go below zero voltage or zero current.

Figure 4:
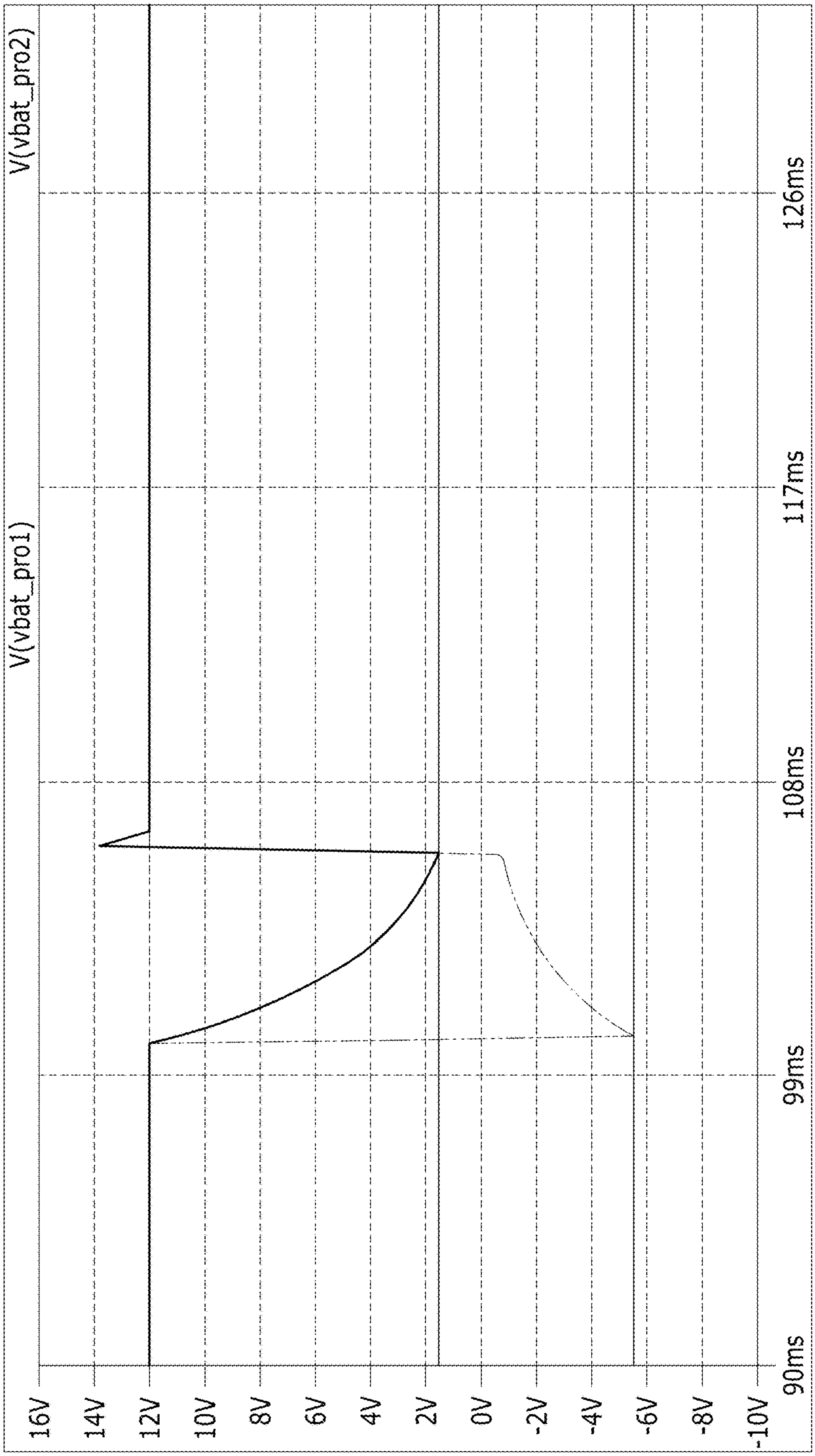
FIG. 4 illustrates an example graph illustrating voltage and current levels of an embodiment of FIG. 2 compared to a prior solution at a 5 ms negative pulse.

FIG. 4 is an example of another graph showing results as related to an embodiment of the circuit of FIG. 2 with a 5 ms negative pulse. As shown, the VBAT_PRO1 may be the previous output voltage and VBAT_PRO2 may be the improvement. The results may be for a 5 ms negative pulse, in one embodiment. The results shown as related to the embodiment may be utilizing a circuit such as one described in FIG. 2, however, any type of embodiment may be utilized.

As shown with respect to the voltage in FIG. 4, the embodiment according to the invention (in one example) does not experience a voltage drop off that goes below 0V as shown in the prior art at the 99 ms timeline. Furthermore, in between the 99 ms and 108 ms timeframe, the voltage that is output to the circuit is higher than that of the prior art. Thus, the output in the current embodiment may never experience negative values in current or voltage, but the prior art circuits may go below zero voltage or zero current.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A circuit in a vehicle electronic control unit (ECU), comprising:

a battery that includes a battery line configured to supply voltage to the circuit that is connected to a load side including at least a capacitor;

a metal-oxide-semiconductor field effect transistor (MOSFET);

an inductor in series with the MOSFET, wherein the inductor is in series with a source channel of the MOSFET;

a transistor in series with the inductor, wherein an emitter channel of the transistor is connected with the inductor and a base of the transistor is connected to a ground; and a diode connected to a drain channel of the MOSFET and the base of the transistor;

wherein in response to the transistor and the diode detecting a difference in voltage, the transistor is configured to turn off the MOSFET utilizing a gate terminal of the MOSFET; and wherein in response to the MOSFET turning off, the inductor is configured to generate an additional response time to the circuit and the capacitor on the load side is configured to supply current to the load side during the additional response time, during a negative transient duration, wherein the circuit does not have negative voltage or current during the negative transient duration.

2. The circuit of claim 1, wherein one or more resistors is connected to both the source channel and gate terminal of the MOSFET.

3. The circuit of claim 1, wherein the transistor is connected to the source channel of the MOSFET.

4. The circuit of claim 1, wherein the inductor is located between the transistor and the source channel of the MOSFET.

5. The circuit of claim 1, wherein the additional response time is a time constant associated with the inductor.

6. The circuit of claim 1, wherein the inductor is directly connected to the source channel of the MOSFET.

7. A circuit in a vehicle electronic control unit (ECU), comprising:

a battery that includes a battery line configured to supply voltage to the circuit that is connected to a load side including at least a capacitor;

a metal-oxide-semiconductor field effect transistor (MOSFET);

an inductor in series with the MOSFET, wherein the inductor is in series with a first channel of the MOSFET;

a transistor in series with the inductor, wherein an emitter channel of the transistor is connected with the inductor and a base of the transistor is connected to a second channel of the MOSFET; and a diode connected to the second channel of the MOSFET and the base of the transistor wherein in response to the transistor and the diode detecting a difference in voltage during a negative transient duration, the transistor is configured to turn off the MOSFET and the inductor is configured to generate an additional response time to the circuit for the capacitor on the load side of the circuit to supply current to the load side, during the negative transient duration wherein the circuit does not have negative voltage or current during the negative transient duration.

8. The circuit of claim 7, wherein the transistor is configured to turn off the MOSFET utilizing a gate terminal of the MOSFET.

9. The circuit of claim 7, wherein the MOSFET is not located at the load side of the circuit.

10. The circuit of claim 7, wherein the first channel is a source channel of the MOSFET.

11. The circuit of claim 10, wherein the source channel is directly connected to the inductor via the battery line.

12. The circuit of claim 10, wherein the source channel is connected to the inductor with no electrical components there between the source channel and the inductor.

13. The circuit of claim 7, wherein the MOSFET is located on a line side of the circuit, and wherein the line side does not include the capacitor.

14. The circuit of claim 7, wherein the capacitor on the load side is a bulk capacitor.

15. A method of providing a circuit in a vehicle electronic control unit (ECU), comprising:

supplying voltage to the circuit utilizing a battery and a battery line, wherein the battery line is connected to a load side including at least a capacitor;

providing a metal-oxide-semiconductor field effect transistor (MOSFET) within the circuit;

providing an inductor in series with a first channel of the MOSFET;

providing a transistor in series with the inductor, wherein an emitter channel of the transistor is connected with the inductor and a base of the transistor is connected to a second channel of the MOSFET;

connecting a diode to both a third channel of the MOSFET and the base of the transistor;

turning off the MOSFET in response to the transistor and the diode detecting a difference in voltage during a negative transient duration; and generating, in response to the MOSFET turning off, an additional response time, during the negative transient duration, to the circuit via the inductor and supplying current to the capacitor on the load side of the circuit via the inductor, wherein the circuit does not have negative voltage or current during the negative transient duration.

16. The method of claim 15, wherein the capacitor is configured to supply current to the load side of the circuit when the MOSFET is turned off and the circuit is in a negative transient duration.

17. The method of claim 15, wherein the circuit includes one or more resistors in parallel with the MOSFET.

18. The method of claim 15, wherein the circuit includes a resistor greater than or equal to 100k ohms in parallel with both the MOSFET and the inductor.

19. The method of claim 15, wherein the method includes providing a resistor in parallel to the capacitor on the load side.

20. The method of claim 15, wherein the additional response time is corresponded to a negative transient duration of the circuit.

* * * * *